United States Patent
Obszarny

[19]
[11] Patent Number: 6,127,686
[45] Date of Patent: Oct. 3, 2000

[54] THIN RESIST PROCESS BY SUB-THRESHOLD EXPOSURE

[75] Inventor: Christopher E. Obszarny, Poughkeepsie, N.Y.

[73] Assignee: International Business Machines Corporation, Armonk, N.Y.

[21] Appl. No.: 09/229,087

[22] Filed: Jan. 11, 1999

Related U.S. Application Data

[62] Division of application No. 08/943,089, Sep. 26, 1997, Pat. No. 5,905,019.

[51] Int. Cl.$^7$ ........................................................ G21K 5/00
[52] U.S. Cl. ............................................................ 250/492.2
[58] Field of Search ............................... 250/492.2, 442.11

[56] References Cited

U.S. PATENT DOCUMENTS

| | | |
|---|---|---|
| 3,950,170 | 4/1976 | Grosholz . |
| 4,440,493 | 4/1984 | Hiraga . |
| 4,598,039 | 7/1986 | Fischer et al. . |
| 4,931,380 | 6/1990 | Owens et al. . |
| 5,097,137 | 3/1992 | Ogoh ..................................... 250/492.2 |
| 5,468,595 | 11/1995 | Livesay . |
| 5,905,019 | 5/1999 | Obszarny .................................. 430/327 |

FOREIGN PATENT DOCUMENTS 5-243114  9/1993  Japan .

*Primary Examiner*—Kiet T. Nguyen
*Attorney, Agent, or Firm*—Scully, Scotty, Murphy & Presser; Tiffany L. Townsend

[57] ABSTRACT

The present invention utilizes a sub-threshold exposure step on an optically sensitive resist that is applied to a semiconductor wafer to thin the resist below the thickness which can be achieved by normal spinning and/or thinning techniques. Furthermore, the thinned resist can be re-expose to UV energies so as to develop patterns on the surface of the semiconductor wafer. An apparatus for vibrating and rotating the resist during the sub-threshold step is also disclosed herein.

12 Claims, 2 Drawing Sheets

THIN RESIST PROCESS BY SUB-THRESHOLD EXPOSURE

RELATED APPLICATIONS

This application is a divisional of U.S. application Ser. No. 08/943,089, filed Sep. 26, 1997 U.S. Pat. No. 5,905,019.

FIELD OF THE INVENTION

The present invention relates to an optically sensitive resist and, more particularly, to a method of preparing an optically sensitive resist having regions wherein the thickness of the resist is below that of which can be obtained by normal spinning and/or thinning techniques. The thinned optically sensitive resist of the present invention is obtained by utilizing a sub-threshold exposure step wherein a dose of UV energy effective to thin predetermined areas of the resist but insufficient to clear the resist under normal development conditions is employed. The remaining resist, after development, retains its sensitivity to exposure; therefore, the resist of the present invention can be re-exposed with a pattern mask to achieve imaging at ultra-thin resist conditions. Additionally, by employing the method of the present invention, a thin resist having various thicknesses can be obtained. An apparatus for preparing a thinned resist comprising means for rotating and vibrating a semiconductor wafer having a resist on one of its surfaces is also disclosed. By employing the apparatus of the of the present invention during the sub-threshold exposure step, a more uniformly exposed resist than heretofore known is obtained.

PRIOR ART

In ordinary lithographic processing, optically sensitive resist materials are applied to semiconductor wafers while the wafer is rotating at high speeds. Speeds of about 2000 rpms are typically employed for spinning resists which have a thickness of about 9000 Å, whereas speeds of about 4000 rpms are employed for spinning resists having a thickness of about 16,000 Å.

Another variable which determines the final thickness of the spun resist is the viscosity of the resist material. High viscosity resist formulations typically result in a thicker resist than formulations derived from low viscosity materials.

Despite being successfully employed, the prior art spinning techniques suffer the following drawback: No matter how fast the resist is spun, there is a limit to how thin the resist can get before the coating uniformity becomes poor and pinholes in the resist begin to form. This phenomena is commonly referred to in the art as "viscosity limited". To overcome the viscosity Limited phenomena, much research endeavor has been ascribed to develop new resist materials of various viscosities. In cases wherein the process requires a resist having multiple thicknesses, resist formulations having different viscosity are typically employed.

In addition to developing new resist formulations, the prior art obtains thin resists by utilizing a process wherein a thick resist is first spun on to a semiconductor wafer and then thinned by subjecting the same to full exposure. This prior art technique of spinning a thick resist and then thinning it with full exposure, which is used for top surface imaging or for defect imaging, avoids numerous expensive resist formulations; spinning beyond viscosity limits and helps to avoid the resist pinhole defects. A potential drawback with this technique is that a resist containing multiple-thicknesses can not be achieved. Additionally, the fully exposed resist does not retain its optical properties thus it is impossible to re-use the resist.

Despite the current advances in the field for developing thin resists, there is still a need for providing a new and improved method which produces an optically sensitive resist having thinned regions which retain its optical properties after thinning.

SUMMARY OF THE INVENTION

One object of the present invention is to provide a method of thinning predetermined regions of an optically sensitive resist to a thickness which is below that of which can be obtained by normal spinning and/or thinning techniques.

Another object of the present invention is to provide a method wherein an optical sensitive resist having various film thicknesses within the resist is produced.

A further object of the present invention is to provide a method of fabricating an optically active thin film resist which after development retains its optical properties and thus can be re-exposed with a pattern mask to achieve imaging at ultra-thin resist conditions.

These as well as other objects are achieved by the method of the present invention wherein a thin film resist region is created in a resist material by utilizing a sub-threshold blanket exposure step after applying the resist to a semiconductor wafer. By "sub-threshold" it is meant partially exposing a resist material to UV light energy such that the dose of said UV light energy is effective to thin some areas of the resist but is insufficient to clear the resist under normal development conditions.

Specifically, the method of the present invention comprises the steps of:

(a) applying a resist on to at least one surface of a semiconductor wafer;

(b) subjecting the resist provided in step (a) to sub-threshold blanket exposure under conditions which are effective to thin predetermined areas of the resist but insufficient to totally clear the resist; and (c) developing the exposure areas of the resist.

In other embodiment of the present invention, the method of the present invention comprises: first conducting steps (a)–(c) followed by: (d) subjecting the developed thinned resist material to full exposure under conditions which are effective to provide patterns on the surface of the semiconductor wafer; and (e) developing the fully exposed regions of the resist. In accordance with this aspect of the present invention, a patterned mask is employed to achieve imaging at ultra-thin imaging conditions.

Another aspect of the present invention relates to an apparatus which can be used to thin the resist. Specifically, the apparatus of the present invention is employed in the sub-threshold blanket exposure step, i.e., step (b) above; and it comprises:

a means for rotating and vibrating a semiconductor wafer containing a resist one at least one surface of said semiconductor wafer;

a UV light energy source positioned above said semiconductor wafer; and a condenser surrounding said UV light energy source and said semiconductor wafer, and other standard optical elements which are normally used in the art of optical system designs to reflect, focus and project light.

Other components of the apparatus of the present invention include:

(I) A uniformer and a diffuser positioned between said UV light energy source and said semiconductor wafer and surrounded by said condenser, wherein said uniformer is located above said diffuser; and (II) A shutter located in said condenser so as to permit entry and exit of a semiconductor wafer from said apparatus.

As stated above, by employing the apparatus of the present invention during the sub-threshold exposure step, a uniformly, thinned resist is obtained since the apparatus of the present invention provides an averaged energy across the resist surface. In the prior art, no rotational and vibrational means are employed in the blanket exposure step.

DETAILED DESCRIPTION OF THE INVENTION

Figure 1A:
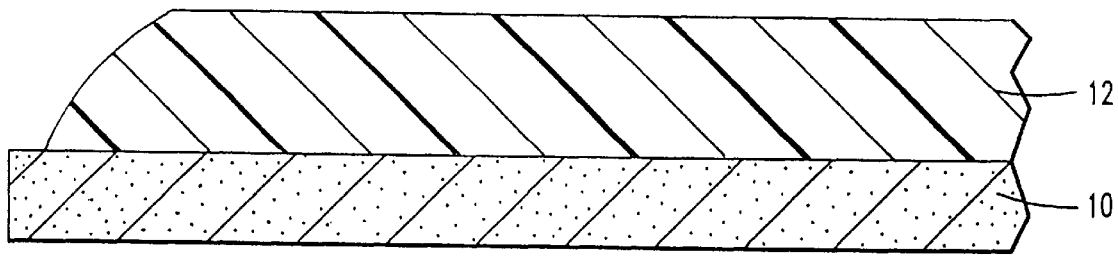
FIGS. 1(a)–(c) are cross-sectional views showing the resist structure after different processing steps of the present invention; (a) after resist spinning, (b) after sub-threshold exposure and development, and (c) after full exposure and development.

The present invention which provides a method of fabricating an optically sensitive resist having thinned areas in predetermined regions of the resist will now be described in detail by reference to the accompanying drawings wherein like reference numerals are used for like and corresponding elements of the drawings.

Referring first to FIG. 1(a), there is shown a structure which comprises a semiconductor wafer 10 and a resist 12 on the surface of semiconductor wafer 10. The semiconductor wafers that may be employed in the present invention are composed of conventional semiconducting materials which include, but are not limited to: silicon, SiGe or GaAs. Of these semiconductor wafers, silicon is most highly preferred in the present invention.

The semiconductor wafers employed in the present invention can be of the p-type or the n-type depending upon the type of structure and/or device being manufactured. Semiconductor wafer 10 can be manufactured using techniques well known to those skilled in the art. An example of such a technique is described in L. F. Thompson, C. G. Wilson, and M. J. Bowden, Introduction to Microlithography, Amer. Chem. Soc. Washington D.C. 1994.

Resist 12 that is employed in the present invention is any optically sensitive resist material that is commonly employed in the art for providing a lithographic pattern to a substrate. Typically, resist 12 is a positive resist material which upon exposure to UV radiation becomes more soluble in a developer solution. The positive resists employed in the present invention normally have two components: a polymeric resin which is optically sensitive and a photoactive compound that is dissolved in a solvent. The photoactive compound is a dissolution inhibitor; i.e. when it is destroyed by exposure to light the polymeric resin becomes more soluble in a developer solution. The positive resist can be manufactured utilizing techniques well known to those skilled in the art or it can be commercially obtained. An example of a commercially available positive resist that can be employed in the present invention is AZ7500 supplied by International Business Machines Corporation which comprises a polyester Novalac resin, propylene glycol monomethyl ether as a solvent, and diazonaphthoquinone as a photoactive compound.

Resist 12 is applied on to one surface of semiconductor wafer 10 utilizing conventional spinning techniques and conditions well known to those skilled in the art. The thickness of the spun down resist may vary depending on the rotational speed of the wafer employed in the spinning process and the type of resist material being spun. Typically, the spinning conditions are such that the resist is spun down to a thickness of from about 5000 to about 45,000 Å. More preferably, resist 12 is spun down under conditions effective to provide a thickness of from about 10,000 to about 11,000 Å.

Prior to applying the resist to the semiconductor wafer, wafer 10 may be cleaned and/or treated to increase the adhesion of semiconductor wafer 10 for resist 12. This treatment consists of processes well known to those skilled in the art and includes, but is not limited to: mechanical roughening with pumice and vapor blast, chemical roughening with etchants and oxide treatments, and chemical adhesion promoters such as silane coupling agents. A high preferred means of improving the adhesion of semiconductor wafer 10 for resist 12 is by treating the wafer with a silane coupling agent such as hexamethyldisalizane (HMDS).

The structure shown in FIG. 1(a) is then exposed to a sub-threshold blanket exposure step under conditions which are effective to thin predetermined areas of the resist material but are insufficient to clear the resist material. Specifically, resist 12 is exposed to a partial blanket exposure step using a UV exposure tool that operates at energies of from about 0.1 to about 2 Joules/cm$^2$. The dose of UV light energy employed in this step of the present invention is a critical parameter which must be met in order to thin the resist as mentioned above. In accordance with the method of the present invention, the dose of UV light energy which is employed in the sub-threshold exposure step is from about 10 to about 130 msec. Highly preferred conditions for the sub-threshold exposure step are as follows: UV light energy of from about 0.06 to about 0.2 Joules/cm$^2$ at a dosage of from about 45 to about 120 msec. It is again emphasized that this step of the present invention is carried out under controlled conditions which are not capable of totally removing the resist material. Instead, the conditions are such that the only some of the exposed resist regions are removed in the development step.

Any wavelength of light within the UV range, e.g. 365 nm (Mid-UV) or 248 nm (Deep-UV), may be employed in the present invention. When a 365 nm IV light energy source is employed, this step of the present invention is carried out at an energy of from about 0.04 to about 2.0, more preferably from about 0.06 to about 1.0, Joules/cm$^2$. When the UV light energy is from a 248 nm light source, the sub-threshold exposure step is carried out at an energy of from about 0.6 to about 1.2, more preferably about 0.8 to about 1.0, Joules/cm$^2$.

Figure 2:
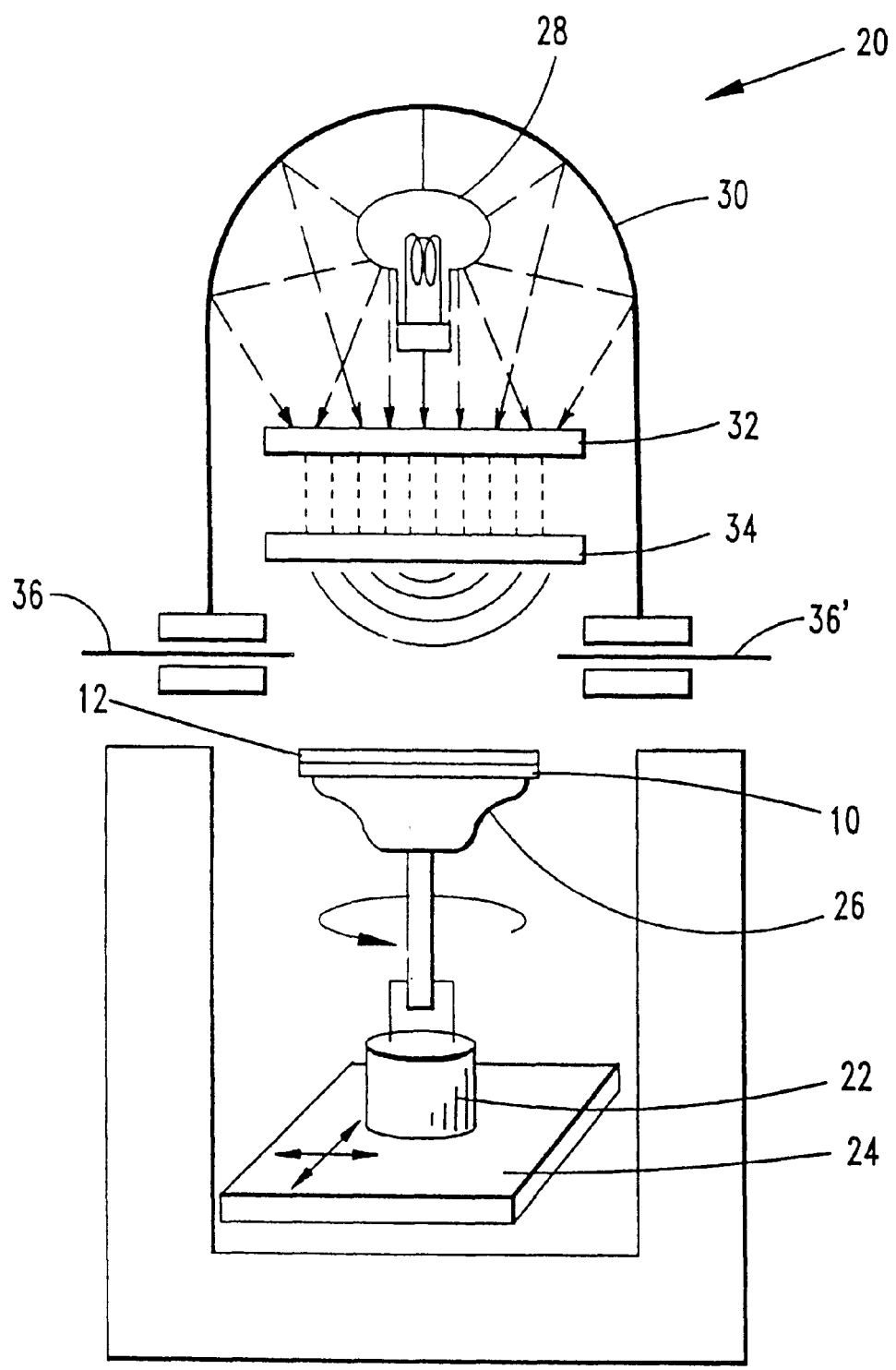
FIG. 2 is a diagram showing the apparatus of the present invention which may be employed during the sub-threshold exposure step.

In addition to using a conventional UV exposure tool, it is highly preferred that the resist structure comprising semiconductor wafer 10 and resist 12 be subjected to vibration and rotation during the sub-threshold exposure step. Vibration and rotation can not be obtained from conventional UV exposure tools. Instead, it is obtained using the apparatus shown in FIG. 2. Specifically, apparatus 20 includes a means for rotating 22 and vibrating 24 the semiconductor wafer shown in FIG. 1(a). The semiconductor wafer 10 containing resist 12 is positioned on stand 26 which is located on top of rotation means 22 and vibration means 24. Apparatus 20 further includes a UV light energy source 28, a condenser 30, a uniformer 32, a diffuser 34 and shutters 36 and 36' for permitting entry and exit of the wafer. The rotational and vibrational parameters are con trolled by a controller or other suitable device which is not shown in FIG. 2.

When the apparatus of the present invention is employed, the rotational speeds employed are typically from about 600 rpm to about 2000 rpm, and a re the result of the application of vibration on the wafer of about 1000 Hz.

The sub-threshold exposed structure is then developed utilizing an organic solvent (hereinafter "developer") that dissolves th e partially exposed areas. Generally, the partially exposed areas of resist 12 are developed by conventional methods which include, but are not limited to: using propylene carbonate, gamma butyrolactone, an ammonium hydroxide such as tetramethyl ammonium hydroxide, diglyme or mixtures thereof. A highly preferred developer employed in the present invention is A2300 MIF (0.263 N) supplied by International Business Machines Corporation which comprises about 2% tetramethyl ammonium hydroxide and 98% water.

Figure 1B:
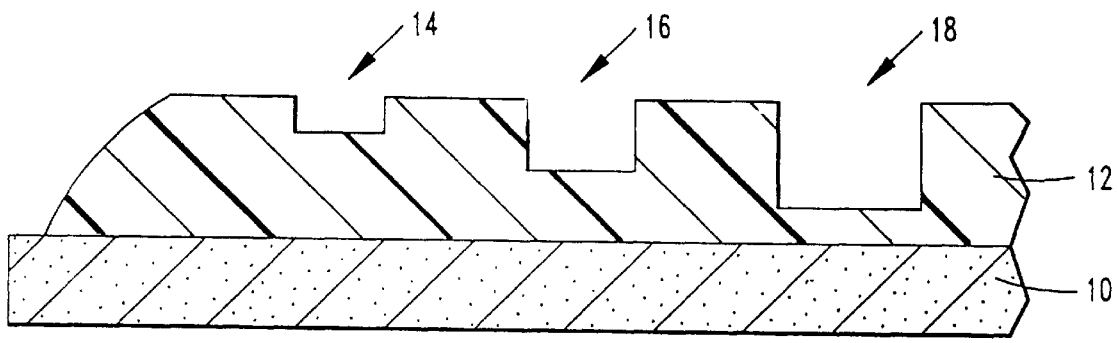

The structure that is formed after the development step of the present invention is shown in FIG. 1(b) wherein resist 12 has thinned regions 14, 16 and 18 therein. As can be seen in this figure, thinned regions 14, 16 and 18 may have different thicknesses, all of which are less than the original thickness of the spun down resist. It is also possible to control the sub-threshold exposure conditions such that the area of exposure is equal to the surface area of the entire wafer, thus creating a full wafer, i.e., blanket, partial expose. The remaining resist in regions 14, 16 and 18 is of reasonable uniformity and, more importantly, it retains its optical properties. Additionally, the thinned resist regions have a thickness below that which can be obtained from prior art spinning and/or thinning processes.

The structure that is formed in FIG. 1(b) may then be subjected to a second exposure step wherein patterns can be formed on the surface of semiconductor wafer 10. This second exposure may be performed with the same wavelength of light from the first exposure mentioned hereinabove, i.e. 368 nm or 248 nm UV light, depending on the resist formulation sensitivity. In accordance with this aspect of the present invention, the structure shown in FIG. 1(b) is exposed to a full blanket exposure step using a UV exposure tool that operates at energies of from about 0.01 to about 0.06 Joules/cm$^2$. More preferably, the UV energy employed in this full exposure step is from about 0.02 to about 0.04 Joules/cm$^2$.

After subjecting the thinned resist to full exposure, the fully exposed areas are developed using standard development techniques and conditions well known to those skilled in the art. This includes using one of the above mentioned developers.

Figure 1C:
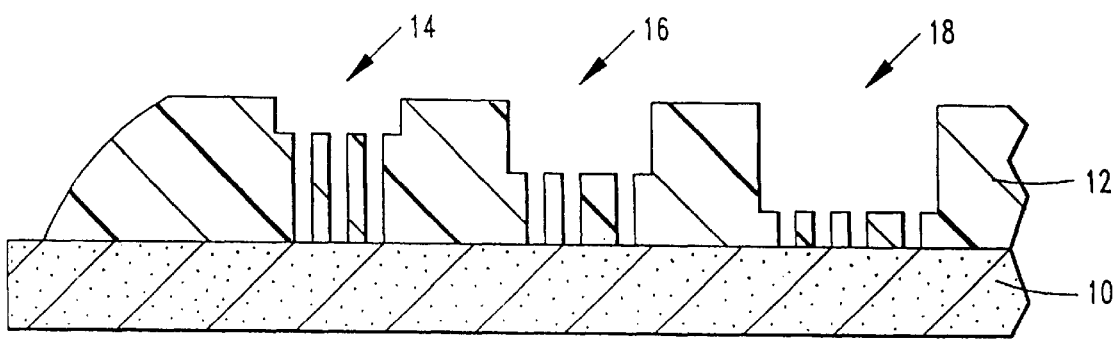

These steps of the present invention, as is shown in FIG. 1(c), remove some of the resist material from thinned regions 14, 16 and 18 such that a pattern consisting of lines/spaces is formed on the surface of wafer 10.

The method of the present invention can be used in preparing any semiconductor device, such as but not limited to: CMOS and MOS devices.

The following example is given to illustrate the scope of the present invention. Because this example is given for illustrative purposes only, the invention embodied therein should not be limited thereto.

EXAMPLE

Clean 8" semiconductor wafers were obtained and treated with hexamethyldisalizane (HMDS) to promote resist to wafer surface adhesion. Each of the wafers were then coated with resist formulation AZ7500 using a SVG Series 90 integrated spin coater. The resist material was spun down to about 11,000 Å.

The wafers were then subjected to the sub-threshold exposure step of the present invention. Specifically, the wafers were exposed given a blanket exposure on a Nikon 11 body step and repeat exposure tool with a dose of 120 ms of UV energy of about 0.06 Joules/cm$^2$. Next, the wafers were developed using a SVG Series 90 integrated puddle developer, bake plate and chill plate. Wafers were also exposed on Miciascan 248 Deep-UV step and scan with 900 mJoules/cm$^2$ as a first pass blanket exposure prior to 365 nm Mid-UV patterned exposure.

The coating thickness after the sub-threshold exposure step was measured on a Prometrix Thin Film Analyzer and was recorded to have a thickness of about 4168 Å with a standard deviation of 109 Å. The wafers were then re-exposed using the Nikon 11 exposure tool with various energy blanket fields and with reticle line/space patterns. The final wafers thus produced were inspected under a microscope to determine printability and final resist quality. In all cases, the wafers produced using the method of the present invention passes the above-identified inspections.

While the invention has been particularly shown and described with respect to the preferred embodiments thereof, it will be understood by those skilled in the art that the foregoing and other changes in form and detail may be made without departing from the spirit and scope of the invention.

Having thus described our invention, what we claim as new, and desire to secure by Letters Patent is:

1. An apparatus for thinning a resist comprising
   (a) means for rotating and vibrating a semiconductor wafer having a resist on at least one surface of said semiconductor wafer;
   (b) a UV light energy source positioned above said semiconductor wafer; and
   (c) a condenser surrounding said UV light energy source and said semiconductor wafer.

2. The apparatus of claim 1 further comprising a uniformer and a diffuser positioned between said UV light energy source and said semiconductor wafer, wherein said uniformer is located above said diffuser.

3. The apparatus of claim 1 further comprising at least one shutter located in said condenser wherein said at least one shutter permits entry and exist of said semiconductor wafer.

4. The apparatus of claim 1 wherein said UV light energy source operates at an energy of from about 0.1 to about 2.0 Joules/cm$^2$ and a dosage of from about 10 to about 130 msec.

5. The apparatus of claim 4 wherein said UV light energy source operates at an energy of from about 0.06 to about 0.2 Joules/cm$^2$ and a dosage of from about 45 to about 120 msec.

6. The apparatus of claim 1 wherein said UV light energy source has a wavelength of 248 or 365 nm.

7. The apparatus of claim 6 wherein said 365 nm UV light energy source has an energy of from about 0.04 to about 2.0 Joules/cm$^2$.

8. The apparatus of claim 7 wherein said 365 nm UV light energy source has an energy of from about 0.06 to about 1.0 Joules/cm$^2$.

9. The apparatus of claim 6 wherein said 248 nm UV light energy source has an energy of from about 0.6 to about 1.2 Joules/cm$^2$.

10. The apparatus of claim 9 wherein said 248 nm UV light energy source has an energy of from about 0.8 to about 1.0 Joules/cm$^2$.

11. The apparatus of claim 1 wherein said rotating means operates at a speed of from about 600 to about 2000 rpm.

12. The apparatus of claim 1 wherein said vibrating means vibrates at about 1000 Hz.

* * * * *